US011031872B2

(12) United States Patent
Eum et al.

(10) Patent No.: US 11,031,872 B2
(45) Date of Patent: Jun. 8, 2021

(54) CONTROLLING OUTPUT VOLTAGE FOR POWER CONVERTER

(71) Applicant: SEMICONDUCTOR COMPONENTS INDUSTRIES, LLC, Phoenix, AZ (US)

(72) Inventors: Hyun-Chul Eum, Gwangmyeong-si (KR); Tae-Sung Kim, Seoul (KR); Young-Jong Kim, Seoul (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/402,833

(22) Filed: May 3, 2019

(65) Prior Publication Data

US 2019/0260296 A1    Aug. 22, 2019

Related U.S. Application Data

(63) Continuation of application No. 15/604,122, filed on May 24, 2017, now Pat. No. 10,326,370.

(Continued)

(51) Int. Cl.
*H02M 3/335* (2006.01)
*H05B 45/00* (2020.01)
(Continued)

(52) U.S. Cl.
CPC ......... *H02M 3/33507* (2013.01); *H02M 1/08* (2013.01); *H02M 1/32* (2013.01); *H02M 3/33515* (2013.01); *H03G 1/0088* (2013.01);

*H05B 45/00* (2020.01); *H05B 45/10* (2020.01); *H05B 45/37* (2020.01); *H05B 45/395* (2020.01);
(Continued)

(58) Field of Classification Search
CPC .......... H02M 1/08; H02M 1/088; H02M 1/32; H02M 2003/1566; H02M 2001/0009; H02M 2001/0025
See application file for complete search history.

(56) References Cited

U.S. PATENT DOCUMENTS 5,341,282 A * 8/1994 Brambilla ................ H02H 3/08
                                                        363/50
6,356,063 B1    3/2002 Brooks
(Continued)

OTHER PUBLICATIONS

Fairchild Semiconductor, "FAN7930 Critical Conduction Mode PFC Controller," Mar. 2010.

*Primary Examiner* — Yusef A Ahmed
(74) *Attorney, Agent, or Firm* — AMPACC Law Group, PLLC

(57) ABSTRACT

A circuit includes an overshoot-and-undershoot (OU) signal generator generating a signal indicating detection of an overshoot or an undershoot of an output signal of the power converter. The circuit further includes a feedback signal modulator receiving a first feedback signal and the signal indicating detection of the overshoot or the undershoot and generating a second feedback signal in response to the first feedback signal and the signal indicating detection of the overshoot or the undershoot. The feedback signal modulator generates the second feedback signal that is different from the first feedback signal during a predetermined time interval after the signal indicating detection of the overshoot or the undershoot has been asserted.

12 Claims, 4 Drawing Sheets

Related U.S. Application Data

(60) Provisional application No. 62/344,780, filed on Jun. 2, 2016.

(51) Int. Cl.

| | | |
|---|---|---|
| *H05B 45/50* | (2020.01) | |
| *H05B 45/44* | (2020.01) | |
| *H05B 45/37* | (2020.01) | |
| *H05B 45/48* | (2020.01) | |
| *H02M 1/08* | (2006.01) | |
| *H05B 45/395* | (2020.01) | |
| *H05B 45/10* | (2020.01) | |
| *H03G 1/00* | (2006.01) | |
| *H02M 1/32* | (2007.01) | |
| *H02M 3/156* | (2006.01) | |
| *H02M 1/00* | (2006.01) | |

(52) U.S. Cl.
CPC ............ *H05B 45/44* (2020.01); *H05B 45/48* (2020.01); *H05B 45/50* (2020.01); *H02M 2001/0009* (2013.01); *H02M 2003/1566* (2013.01)

(56) References Cited

U.S. PATENT DOCUMENTS

| | | | |
|---|---|---|---|
| 6,552,517 B1 | 4/2003 | Ribellino et al. | |
| 6,828,766 B2 | 12/2004 | Corva et al. | |
| 7,239,532 B1 | 7/2007 | Hsu et al. | |
| 7,548,047 B1 * | 6/2009 | Dasgupta | H02M 3/156 323/283 |
| 9,035,632 B2 * | 5/2015 | Futamura | H02M 3/1588 323/282 |
| 9,276,477 B2 * | 3/2016 | Thomas | H02M 3/158 |
| 9,755,517 B2 * | 9/2017 | Kobayashi | H02M 3/158 |
| 9,806,617 B1 | 10/2017 | Ozawa | H03K 3/02337 |
| 9,819,264 B1 * | 11/2017 | Boezen | H05B 45/37 |
| 9,948,185 B2 * | 4/2018 | Unno | H02M 3/158 |
| 9,954,450 B2 * | 4/2018 | Chen | H02M 3/33523 |
| 9,966,851 B2 * | 5/2018 | Ouyang | H02M 3/1582 |
| 2002/0105316 A1 | 8/2002 | Takahashi | |
| 2002/0180410 A1 * | 12/2002 | Brooks | H02M 3/156 323/282 |
| 2005/0088856 A1 * | 4/2005 | Yamamoto | H02M 3/1588 363/19 |
| 2006/0109039 A1 * | 5/2006 | Wu | H03K 3/00 327/172 |
| 2009/0015225 A1 * | 1/2009 | Turchi | H02M 1/4225 323/283 |
| 2009/0141520 A1 * | 6/2009 | Grande | H02M 3/33523 363/21.16 |
| 2010/0001702 A1 * | 1/2010 | Tateishi | H02M 3/1588 323/282 |
| 2010/0123447 A1 | 5/2010 | Vecera et al. | |
| 2010/0237844 A1 | 9/2010 | Yeh | |
| 2010/0321956 A1 * | 12/2010 | Yeh | H02M 3/33507 363/16 |
| 2011/0019446 A1 * | 1/2011 | Wu | H02M 3/33523 363/79 |
| 2011/0122660 A1 * | 5/2011 | Cacciotto | H02M 3/157 363/21.18 |
| 2011/0205764 A1 | 8/2011 | Sheng et al. | |
| 2012/0113684 A1 * | 5/2012 | Wang | H02M 3/335 363/21.01 |
| 2013/0033905 A1 * | 2/2013 | Lin | H02M 3/33507 363/21.13 |
| 2013/0038313 A1 * | 2/2013 | Gotoh | H02M 3/156 323/288 |
| 2013/0039098 A1 * | 2/2013 | Zhan | H02M 7/2176 363/21.18 |
| 2013/0329468 A1 * | 12/2013 | Yang | H02M 3/33523 363/21.15 |
| 2014/0176102 A1 * | 6/2014 | Tang | H03M 1/38 323/283 |
| 2014/0253082 A1 | 9/2014 | Swanson et al. | |
| 2015/0155784 A1 | 6/2015 | Ouyang et al. | |
| 2015/0263617 A1 * | 9/2015 | Xue | H02M 3/156 323/271 |
| 2015/0311810 A1 * | 10/2015 | Chen | H02M 3/33523 363/21.13 |
| 2015/0333630 A1 * | 11/2015 | Pastore | H02M 3/33515 363/21.17 |
| 2016/0226239 A1 | 8/2016 | Yang et al. | |
| 2016/0276931 A1 * | 9/2016 | Trichy | H02M 3/158 |
| 2016/0299520 A1 * | 10/2016 | Mangina | H02M 3/156 |
| 2016/0373109 A1 * | 12/2016 | Hwang | H02M 1/08 |
| 2016/0380530 A1 * | 12/2016 | Maruyama | H02M 1/4225 323/210 |
| 2017/0019030 A1 * | 1/2017 | Sugawara | H02M 1/4225 |
| 2017/0077876 A1 * | 3/2017 | Quilligan | H03F 3/45475 |
| 2017/0163026 A1 * | 6/2017 | Yang | H02M 1/44 |
| 2017/0358984 A1 | 12/2017 | Unno | |
| 2018/0013348 A1 * | 1/2018 | Paul | H02M 1/083 |
| 2018/0062527 A1 * | 3/2018 | Lu | H02M 1/096 |
| 2018/0097449 A1 * | 4/2018 | Kim | H02M 1/4225 |
| 2019/0081553 A1 * | 3/2019 | Sugimoto | H02M 1/4225 |
| 2020/0083808 A1 * | 3/2020 | Peretz | H02M 3/1588 |

* cited by examiner

CONTROLLING OUTPUT VOLTAGE FOR POWER CONVERTER

CROSS-REFERENCE TO RELATED APPLICATIONS

This application is a Continuation of U.S. patent application Ser. No. 15/604,122, filed on May 24, 2017, which claims the benefit of U.S. Provisional Application No. 62/344,780 filed on Jun. 2, 2016, the entire contents of which are incorporated by reference herein in its entirety.

BACKGROUND

This present disclosure relates to integrated circuit devices, and more particularly to a power converter.

A power converter converts an input voltage into an output voltage and provides the output voltage to a load. The power converter may regulate the output voltage at a substantially constant level using a feedback loop for power factor correction (PFC) control. However, under a load transient condition, a relatively narrow bandwidth of the feedback loop may lead to an overshoot or an undershoot of the output voltage.

DETAILED DESCRIPTION

Embodiments relate to power converters and controlling an output signal. In an embodiment, a power converter receives an input voltage and provides an output voltage to a load. A first feedback signal is generated in response to a tracking signal (e.g., a sampled signal), where the tracking signal indicates an output signal of the power converter. An overshoot of the sampled signal or an undershoot of the sampled signal is detected, and a second feedback signal is generated in response to the detection result and the first feedback signal. A modulation signal is generated in response to the second feedback signal.

Figure 1:
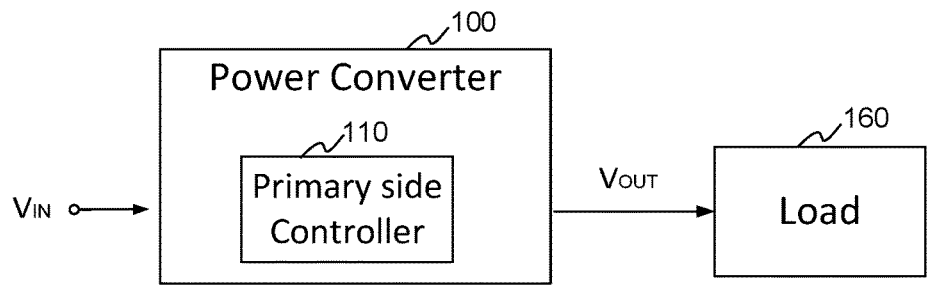
FIG. 1 illustrates a power converter according to an embodiment.

FIG. 1 illustrates a power converter 100 according to an embodiment. The power converter 100 receives an input voltage $V_{IN}$ and provides an output voltage $V_{OUT}$ to a load 160.

The power converter 100 in FIG. 1 includes a primary side controller 110. The primary side controller 110 in FIG. 1 may be integrated in a semiconductor chip, and the semiconductor chip may be packaged by itself or together with one or more other semiconductor chips.

The load 160 in FIG. 1 may include one or more integrated chips (ICs). In an embodiment, the output voltage $V_{out}$ is used to supply power to a Central Processing Unit (CPU), a Graphics Processing Unit (GPU), an integrated memory circuit, a battery charger, a light emitting diode (LED), or other types of electrical load.

Figure 2:
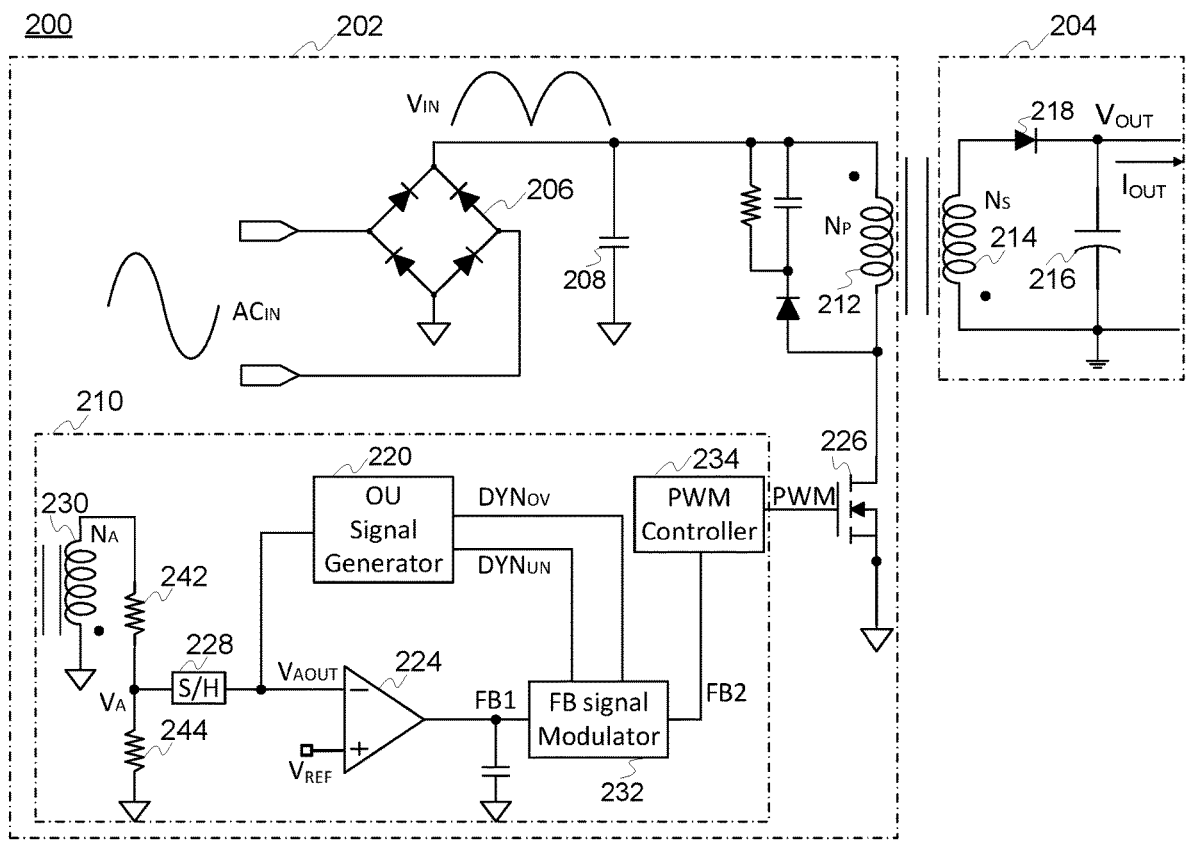
FIG. 2 illustrates a power converter suitable for use as the power converter of FIG. 1 according to an embodiment.

FIG. 2 illustrates a power converter 200 suitable for use as the power converter 100 of FIG. 1. The power converter 200 includes a primary side circuit 202 and a secondary side circuit 204.

The primary side circuit 202 in FIG. 2 includes a bridge rectifier 206, a capacitor 208, a primary winding 212, a switching device 226, a sense resistor 230, and a primary side controller 210. A power supply (not shown) provides an AC input signal $AC_{IN}$ to the bridge rectifier 206, which inverts the negative halves of the received AC signal to generate a rectified AC signal (or an input voltage) $V_{IN}$. The input voltage $V_{IN}$ is applied to the primary winding 212 of the power converter 200 in FIG. 2.

In an embodiment, the primary side controller 210 (e.g., FIG. 2) includes an auxiliary winding 230, first and second resistors 242 and 244, a sample-and-hold (S/H) circuit 228, an amplifier 224, an overshoot-and-undershoot (OU) signal generator 220, a feedback signal modulator 232, a pulse width modulation (PWM) controller (or a modulation controller) 234. The primary side controller 210 in FIG. 2 generates a PWM signal (or a modulation signal) PWM to control (e.g., turn on or off) a switching device 226.

When the switching device 226 in FIG. 2 is turned on, a first current flowing through the switching device 226 increases from zero to a peak value and energy is stored in the primary winding 212. When the switching device 226 is turned off, the stored energy causes a diode 218 in the secondary side circuit 204 to be turned on, resulting in a second current flowing through the diode 218. During a diode conduction period, a sum of an output voltage $V_{OUT}$ and a diode forward-voltage drop is reflected to the auxiliary winding 230 in FIG. 2 and a magnitude of the second current decreases. Because the diode forward-voltage drop decreases as the second current decreases, the reflected voltage $V_{NA}$ across the auxiliary winding 230 at a time proximate to the end of the diode conduction period can be represented by Equation 1:

$$V_{NA} \approx V_{OUT} \times \frac{N_A}{N_S}. \quad \text{Equation 1}$$

In Equation 1, $N_A$ is a number of turns of the auxiliary winding 230 and $N_S$ is a number of turns of the secondary winding 214.

The first and second resistors 242 and 244 in FIG. 2 function as a voltage divider and generate a divided voltage $V_A$ at a node between the first and second resistors 242 and 244. The S/H circuit 228 in FIG. 2 samples the divided voltage $V_A$ at the time proximate to the end of the diode conduction period, and thus a tracking signal (e.g., a tracking voltage) $V_{AOUT}$ corresponding to the sampled voltage has a level proportional to that of the output voltage $V_{OUT}$. In an embodiment, the S/H circuit 228 samples the divided voltage $V_A$ at the time corresponding to 70%, 85%, or 90% of the diode conduction period at a previous switching cycle. Although the embodiment shown in FIG. 2 includes the S/H circuit 228 to sample the divided voltage $V_A$ at a specific time to generate the sampled voltage $V_{AOUT}$, embodiments of the present disclosure are not limited thereto. In an embodiment, the S/H circuit 228 may be omitted, and the divided voltage $V_A$ can be used as the tracking signal $V_{AOUT}$ to continuously track the output voltage $V_{OUT}$. In another embodiment, the auxiliary winding 230 may be further omitted, and a scaled version of the output voltage $V_{OUT}$ can be used as the tracking signal $V_{AOUT}$.

The amplifier 224 in FIG. 2 generates a first feedback signal FB1 in response to the sampled voltage $V_{AOUT}$ and a reference voltage $V_{REF}$. In an embodiment, the amplifier 224 is a transconductance amplifier, which generates a current having a magnitude proportional to a difference between the sampled voltage $V_{AOUT}$ and the reference voltage $V_{REF}$.

The OU signal generator 220 in FIG. 2 receives the sampled voltage $V_{AOUT}$ and generates an overshoot signal $DYN_{OV}$ and an undershoot signal $DYN_{UN}$ in response to the sampled voltage $V_{AOUT}$.

Figure 3:
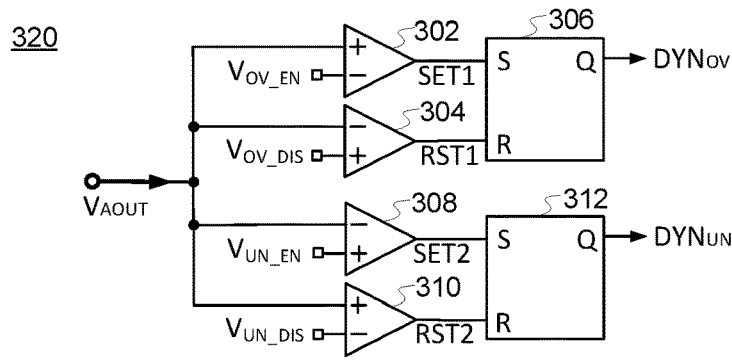
FIG. 3 illustrates an overshoot-and-undershoot (OU) signal generator suitable for use as an OU signal generator of FIG. 2 according to an embodiment.

In an embodiment, the overshoot signal $DYN_{OV}$ transitions from a first logic value (e.g., a logic low value) to a second logic value (e.g., a logic high value) when the sampled voltage $V_{AOUT}$ becomes equal to or greater than an overshoot enable threshold voltage (e.g., an overshoot enable threshold voltage $V_{OV\_EN}$ in FIG. 3), and transitions from the logic high value to the logic low value when the sampled voltage $V_{AOUT}$ becomes less than an overshoot disable threshold voltage (e.g., an overshoot disable threshold voltage $V_{OV\_DIS}$ in FIG. 3). In another embodiment, the overshoot signal $DYN_{OV}$ transitions from a logic low value to a logic high value at a first time (e.g., a first time $t_1$ in FIG. 9A) when the sampled voltage $V_{AOUT}$ becomes equal to or greater than an overshoot enable threshold voltage, and transitions from the logic high value to the logic low value at a second time (e.g., a first time $t_2$ in FIG. 9A) corresponding to a sum of the first time and a predetermined time interval.

In an embodiment, the undershoot signal $DYN_{UN}$ transitions from a first logic value (e.g., a logic low value) to a second logic value (e.g., a logic high value) when the sampled voltage $V_{AOUT}$ becomes less than an undershoot enable threshold voltage (e.g., an undershoot enable threshold voltage $V_{UN\_EN}$ in FIG. 3), and transitions from the logic high value to the logic low value when the sampled voltage $V_{AOUT}$ becomes equal to or greater than an undershoot disable threshold voltage (e.g., an undershoot disable threshold voltage $V_{UN\_DIS}$ in FIG. 3). In another embodiment, the undershoot signal $DYN_{UN}$ transitions from a logic low value to a logic high value at a first time (e.g., a first time $t_1$ in FIG. 9B) when the sampled voltage $V_{AOUT}$ becomes less than an undershoot enable threshold voltage, and transitions from the logic high value to the logic low value at a second time (e.g., a second time $t_2$ in FIG. 9B) corresponding to a sum of the first time and a predetermined time interval.

The feedback signal modulator 232 in FIG. 2 receives the first feedback signal FB1, the overshoot signal $DYN_{OV}$, and the undershoot signal $DYN_{UN}$ to generate a second feedback signal FB2 in response to the received signals FB1, $DYN_{OV}$, and $DYN_{UN}$. Although the embodiment shown in FIG. 2 uses the first feedback signal FB1 and the second feedback signal FB2, which are analog signals, embodiments of the present disclosure are not limited thereto. In an embodiment, an analog-to-digital converter (not shown) may be added to receive the sampled voltage $V_{AOUT}$ and provide a digital version of the first feedback signal FB1 the feedback signal modulator 232. In such an embodiment, the feedback signal modulator 232 generates a digital version of the second feedback signal FB2 in response to the received signals FB1, $DYN_{OV}$, and $DYN_{UN}$.

When the overshoot signal $DYN_{OV}$ and the undershoot signal $DYN_{UN}$ have logic low values, respectively, the feedback signal modulator 232 generates the second feedback signal FB2 substantially the same as the first feedback signal FB1. When either the overshoot signal $DYN_{OV}$ or the undershoot signal $DYN_{UN}$ has a logic high value, the feedback signal modulator 232 generates the second feedback signal FB2 different from the first feedback signal FB1.

The PWM controller 234 in FIG. 2 generates the PWM signal in response to the second feedback signal FB2. A duty cycle of the PWM signal varies with a value of the second feedback signal FB2.

In an embodiment, when the overshoot signal $DYN_{OV}$ has a logic high value, the second feedback signal FB2 decreases at a faster rate than the first feedback signal FB1 to quickly reduce one or both of an on-time duration and a switching frequency of the PWM signal PWM. As a result, the primary side controller 210 in FIG. 2 may prevent a severe overshoot of the output voltage $V_{OUT}$.

In an embodiment, when the undershoot signal $DYN_{UN}$ has a logic high value, the second feedback signal FB2 increases at a faster rate than the first feedback signal FB1 to quickly increase one or both of the on-time duration and the switching frequency of the PWM signal PWM. As a result, the primary side controller 210 in FIG. 2 may prevent a severe undershoot of the output voltage $V_{OUT}$.

FIG. 3 illustrates an OU signal generator 320 suitable for use as the OU signal generator 220 of FIG. 2 according to an embodiment. The OU signal generator 320 in FIG. 3 includes first and second comparators 302 and 304, a first flip-flop 306, third and fourth comparators 308 and 310, and a second flip-flop 312.

The first comparator 302 in FIG. 3 compares a sampled voltage $V_{AOUT}$ to an overshoot enable threshold voltage $V_{OV\_EN}$, and generates a first set signal SET1 having a first logic value (e.g., a logic high value) when the sampled voltage $V_{AOUT}$ is equal to or greater than the overshoot enable threshold voltage $V_{OV\_EN}$. The sampled voltage $V_{AOUT}$ has a magnitude proportional to an output voltage (e.g., the output voltage $V_{OUT}$ of FIG. 2) of a power converter (e.g., the power converter 200 of FIG. 2).

The second comparator 304 in FIG. 3 compares the sampled voltage $V_{AOUT}$ to an overshoot disable threshold voltage $V_{OV\_DIS}$, and generates a first reset signal RST1 having a logic high value when the sampled voltage $V_{AOUT}$ is less than the overshoot disable threshold voltage $V_{OV\_DIS}$. The overshoot disable threshold voltage $V_{OV\_DIS}$ has a level lower than that of the overshoot enable threshold voltage $V_{OV\_EN}$.

In an embodiment, the first flip-flop 306 in FIG. 3 is a set/reset (RS) flip-flop. The RS flip-flop 306 generates an overshoot signal $DYN_{OV}$ having a first logic value (e.g., a logic high value) when the first set signal SET1 has a logic high value, and generates the overshoot signal $DYN_{OV}$ having a second logic value (e.g., a logic low value) when the first reset signal RST1 has a logic high value. Although the embodiment shown in FIG. 3 includes the first and second comparators 302 and 304 and the first flip-flop 306, embodiments of the present disclosure are not limited thereto. In an embodiment, a single comparator (not shown) having a given hysteresis can replace with the first and second comparators 302 and 304 and the first flip-flop 306. For example, the given hysteresis makes the comparator generate an overshoot signal $DYN_{OV}$ having a first logic value (e.g., a logic high value) when the sampled voltage $V_{AOUT}$ is equal to or greater than the overshoot enable threshold voltage $V_{OV\_EN}$ and generate the overshoot signal $DYN_{OV}$ having a second logic value (e.g., a logic low value) when the sampled voltage $V_{AOUT}$ is less than the overshoot disable threshold voltage $V_{OV\_DIS}$.

The third comparator 308 in FIG. 3 compares the sampled voltage $V_{AOUT}$ to an undershoot enable threshold voltage $V_{UN\_EN}$, and generates a second set signal SET2 having a logic high value when the sampled voltage $V_{AOUT}$ is less than the undershoot enable threshold voltage $V_{UN\_EN}$.

The fourth comparator 310 in FIG. 3 compares the sampled voltage $V_{AOUT}$ to an undershoot disable threshold voltage $V_{UN\_DIS}$, and generates a second reset signal RST2 having a logic high value when the sampled voltage $V_{AOUT}$ is equal to or greater than the undershoot disable threshold voltage $V_{UN\_DIS}$. The undershoot disable threshold voltage $V_{UN\_DIS}$ has a level higher than that of the undershoot enable threshold voltage $V_{UN\_EN}$.

In an embodiment, the second flip-flop 312 in FIG. 3 is a set/reset (RS) flip-flop. The RS flip-flop 312 generates an undershoot signal $DYN_{UN}$ having a first logic value (e.g., a logic high value) when the second set signal SET2 has a logic high value, and generates the undershoot signal $DYN_{UN}$ having a second logic value (e.g., a logic low value) when the second reset signal RST2 has a logic high value. Although the embodiment shown in FIG. 3 includes the third and fourth comparators 308 and 310 and the second flip-flop 312, embodiments of the present disclosure are not limited thereto. In an embodiment, a single comparator (not shown) having a given hysteresis can replace with the third and fourth comparators 308 and 310 and the second flip-flop 312. For example, the given hysteresis makes the comparator generate an undershoot signal $DYN_{UN}$ having a first logic value (e.g., a logic high value) when the sampled voltage $V_{AOUT}$ is less than the undershoot enable threshold voltage $V_{UN\_EN}$ and generate the undershoot signal $DYN_{UN}$ having a second logic value (e.g., a logic low value) when the sampled voltage $V_{AOUT}$ is equal to or greater than the undershoot disable threshold voltage $V_{UN\_DIS}$.

Figure 4:
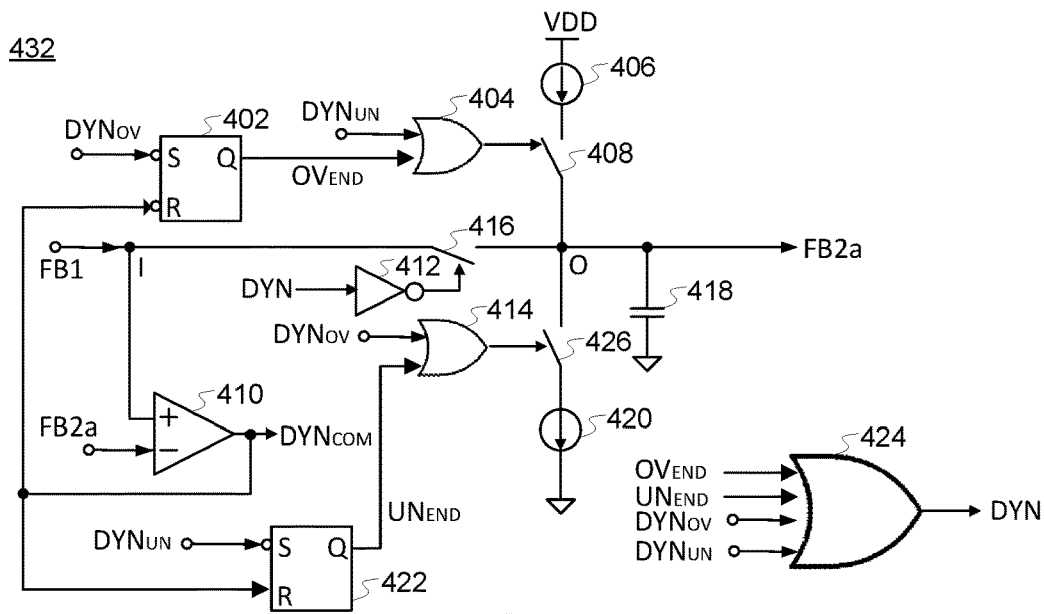
FIG. 4 illustrates a feedback signal modulator suitable for use as a feedback signal modulator of FIG. 2 according to an embodiment.

FIG. 4 illustrates a feedback signal modulator 432 suitable for use as the feedback signal modulator 232 of FIG. 2 according to an embodiment. The feedback signal modulator 432 in FIG. 4 includes first and second flip-flops 402 and 422, first and second logic gates 404 and 414, first and second current sources 406 and 420, an inverter 412, a comparator 410, a capacitor 418, first, second, and third switching devices 408, 416, and 426, and a third logic gate 424.

The feedback signal modulator 432 in FIG. 4 receives a first feedback signal FB1 through an input node I. The input node I is connected to a first end of the second switching device 416 and to a non-inverting input of the comparator 410.

The comparator 410 in FIG. 4 has an inverting input receiving a second feedback signal FB2a. The comparator 410 in FIG. 4 compares the first feedback signal FB1 to the second feedback signal FB2a, and generates a comparison signal $DYN_{COM}$.

The first flip-flop 402 in FIG. 4 receives an inverted version of the comparison signal $DYN_{COM}$ and an inverted version of an overshoot signal $DYN_{OV}$. In an embodiment, the first flip-flop 402 is an RS flip-flop, and the RS flip-flop 402 generates an overshoot end signal $OV_{END}$ having a first logic value (e.g., a logic high value) when the overshoot signal $DYN_{OV}$ has a logic low value, and generates the overshoot end signal $OV_{END}$ having a second logic value (e.g., a logic low value) when the comparison signal $DYN_{COM}$ has a logic low value.

The first logic gate 404 in FIG. 4 receives the overshoot end signal $OV_{END}$ and an undershoot signal $DYN_{UN}$, and performs a logical operation on the received signals $OV_{END}$ and $DYN_{UN}$. In an embodiment, the first logic gate 404 is an OR gate and performs an OR logical operation on the overshoot end signal $OV_{END}$ and the undershoot signal $DYN_{UN}$ to provide an output signal to the first switching device 408.

The first switching device 408 in FIG. 4 is turned on or off in response to the output signal from the first logic gate 404. In an embodiment, the first switching device 408 is turned on when the output signal from the first logic gate 404 has a first logic value (e.g., a logic high value), and is turned off when the output signal from the first logic gate 404 has a second logic value (e.g., a logic low value).

The second flip-flop 422 in FIG. 4 receives the comparison signal $DYN_{COM}$ and an inverted version of the undershoot signal $DYN_{UN}$. In an embodiment, the second flip-flop 422 is an RS flip-flop, and the RS flip-flop 422 generates an undershoot end signal $UN_{END}$ having a first logic value (e.g., a logic high value) when the undershoot signal $DYN_{UN}$ has a logic low value, and generates the undershoot end signal $UN_{END}$ having a second logic value (e.g., a logic low value) when the comparison signal $DYN_{COM}$ has a logic high value.

The second logic gate 414 in FIG. 4 receives the undershoot end signal $UN_{END}$ and the overshoot signal $DYN_{OV}$, and performs a logical operation on the received signals $UN_{END}$ and $DYN_{OV}$. In an embodiment, the second logic gate 414 is an OR gate and performs an OR logical operation on the undershoot end signal $UN_{END}$ and the overshoot signal $DYN_{OV}$ to provide an output signal to the third switching device 426.

The third switching device 426 in FIG. 4 is turned on or off in response to the output signal from the second logic gate 414. In an embodiment, the third switching device 426 is turned on when the output signal from the second logic gate 414 has a first logic value (e.g., a logic high value), and is turned off when the output signal from the second logic gate 414 has a second logic value (e.g., a logic low value).

The third logic gate 424 in FIG. 4 receives the overshoot end signal $OV_{END}$, the undershoot end signal $UN_{END}$, the overshoot signal $DYN_{OV}$, and the undershoot signal $DYN_{UN}$. In an embodiment, the third logic gate 424 is an OR gate and performs an OR logical operation on the received signals $OV_{END}$, $UN_{END}$, $DYN_{OV}$, and $DYN_{UN}$ to generate a dynamic control signal DYN.

The inverter 412 in FIG. 4 receives the dynamic control signal DYN, and inverts the dynamic control signal DYN to turn on or off the second switching device 416. In an embodiment, the second switching device 416 is turned on to couple the input node I to an output node O when the dynamic control signal DYN has a logic low value.

The capacitor 418 in FIG. 4 has a first end connected to the output node O and a second end connected to a ground. The feedback signal modulator 432 in FIG. 4 outputs the second feedback signal FB2a through the output node O. Although the embodiment shown in FIG. 4 includes the capacitor 418, embodiments of the present disclosure are not limited thereto. In an embodiment using digital versions of the first feedback signal FB1 and the second feedback signal FB2a, the capacitor 418 may be replaced with a digital circuit element (e.g., a digital counter).

Figure 5A:
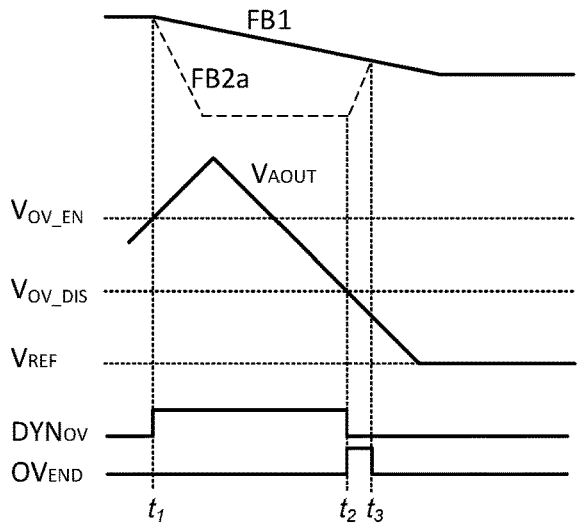
FIG. 5A illustrates example waveforms of a first feedback signal, a second feedback signal, a sampled voltage, an overshoot signal, and an overshoot end signal when an overshoot of an output voltage of the power converter of FIG. 2 occurs under a load transient condition.

An operation of a primary side controller (e.g., the primary side controller 210 in FIG. 2), which includes the OU signal generator 320 in FIG. 3 and the feedback signal modulator 432 in FIG. 4, is explained below in more detail below with reference to FIGS. 5A and 5B. FIG. 5A illustrates example waveforms of the first feedback signal FB1, the second feedback signal FB2a, the sampled voltage $V_{AOUT}$, the overshoot signal $DYN_{OV}$, and the overshoot end signal $OV_{END}$ when an overshoot of an output voltage (e.g., the output voltage $V_{OUT}$ in FIG. 2) occurs under a load transient condition.

At a first time $t_1$ in FIG. 5A, the sampled voltage $V_{AOUT}$ becomes equal to or greater than the overshoot enable threshold voltage $V_{OV\_EN}$, and the first flip-flop 306 in FIG. 3 generates an overshoot signal $DYN_{OV}$ having a logic high value in response to the first set signal SET1 having a logic high value. In an embodiment, the overshoot enable threshold voltage $V_{OV\_EN}$ has a level equal to or greater than 110% of a level of a predetermined reference voltage $V_{REF}$. The second logic gate 414 in FIG. 4 generates an output signal having a logic high value in response to the overshoot signal $DYN_{OV}$ having a logic high value to turn on the third switching device 426 in FIG. 4. The third logic gate 424 in FIG. 4 generates the dynamic control signal DYN having a logic high value in response to the overshoot signal $DYN_{OV}$ having a logic high value to turn off the second switching device 416 in FIG. 4.

During a time interval between the first time $t_1$ and a second time $t_2$, the second switching device 416 in FIG. 4 is turned off and the third switching device 426 in FIG. 4 is turned on. A current flowing through the second current source 420 in FIG. 4 discharges the capacitor 418 in FIG. 4, and thus a value of the second feedback signal FB2a is decreased at a faster rate than the first feedback signal FB1 until the value of the second feedback signal FB2a reaches a minimum value (e.g., zero volt).

When the value of the second feedback signal FB2a is decreased, a PWM controller (e.g., the PWM controller 234 in FIG. 2) reduces one or both of an on-time duration and a switching frequency of a PWM signal (e.g., the PWM signal PWM in FIG. 2). As a result, the primary side controller including the OU signal generator 320 in FIG. 3 and the feedback signal modulator 432 in FIG. 4 may prevent a severe overshoot of an output voltage (e.g., the output voltage $V_{OUT}$ in FIG. 2).

At the second time $t_2$, the sampled voltage $V_{AOUT}$ becomes less than the overshoot disable threshold voltage $V_{OV\_DIS}$, and the first flip-flop 306 in FIG. 3 generates the overshoot signal $DYN_{OV}$ having a logic low value in response to the first reset signal RET1 having a logic high value. In an embodiment, the overshoot disable threshold voltage $V_{OV\_DIS}$ has a level substantially equal to 105% of that of the reference voltage $V_{REF}$. As a result, the flip-flop 402 in FIG. 4 generates the overshoot end signal $OV_{END}$ having a logic high value in response to the overshoot signal $DYN_{OV}$ having a logic low value, and the first logic gate 404 in FIG. 4 generates an output signal having a logic high value to turn on the first switching device 408 in FIG. 4. The third logic gate 424 in FIG. 4 generates the dynamic control signal DYN having a logic high value in response to the overshoot end signal $OV_{END}$ having a logic high value to turn off the second switching device 416 in FIG. 4.

During a time interval between the second time $t_2$ and a third time t3, the second switching device 416 in FIG. 4 is turned off and the first switching device 408 in FIG. 4 is turned on. A current flowing through the first current source 406 in FIG. 4 charges the capacitor 418 in FIG. 4, and thus a value of the second feedback signal FB2a is increased until the second feedback signal FB2a reaches the first feedback signal FB1.

At the third time t3 when the second feedback signal FB2a reaches the first feedback signal FB1, the comparator 410 in FIG. 4 generates the comparison signal $DYN_{COM}$ having a logic low value in response to the second feedback signal FB2a and the first feedback signal FB1, and thus the flip-flop 402 in FIG. 4 generates the overshoot end signal $OV_{END}$ having a logic low value. The third logic gate 424 in FIG. 4 generates the dynamic control signal DYN having a logic low value, and thus the inverter 412 in FIG. 4 generates an output signal having a logic high value to turn on the second switching device 416 in FIG. 4. As a result, the second switching device 416 in FIG. 4 couples the input node I in FIG. 4 to the output node O in FIG. 4 to generate the second feedback signal FB2a, which is substantially the same as the first feedback signal FB1.

Figure 5B:
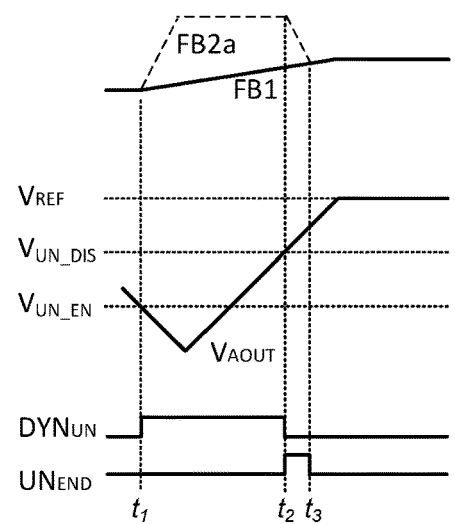
FIG. 5B illustrates example waveforms of the first feedback signal, a second feedback signal, the sampled voltage, an undershoot signal, and an undershoot end signal when an undershoot of the output voltage of the power converter of FIG. 2 occurs under a load transient condition.

FIG. 5B illustrates example waveforms of the first feedback signal FB1, the second feedback signal FB2a, the sampled voltage $V_{AOUT}$, the undershoot signal $DYN_{UN}$, and the undershoot end signal $UN_{END}$ when an undershoot of the output voltage occurs under a load transient condition.

At a first time $t_1$ in FIG. 5B, the sampled voltage $V_{AOUT}$ becomes less than the undershoot enable threshold voltage $V_{UN\_EN}$, and the second flip-flop 312 in FIG. 3 generates an undershoot signal $DYN_{UN}$ having a logic high value in response to the second set signal SET2 having a logic high value. In an embodiment, the undershoot enable threshold voltage $V_{UN\_EN}$ has a level substantially equal to or less than 90% of that of the predetermined reference voltage $V_{REF}$. The first logic gate 404 in FIG. 4 generates an output signal having a logic high value in response to the undershoot signal $DYN_{UN}$ having a logic high value to turn on the first switching device 408 in FIG. 4. The third logic gate 424 in FIG. 4 generates the dynamic control signal DYN having a logic high value in response to the undershoot signal $DYN_{UN}$ having a logic high value to turn off the second switching device 416 in FIG. 4.

During a time interval between the first time $t_1$ and a second time $t_2$, the second switching device 416 in FIG. 4 is turned off and the first switching device 408 in FIG. 4 is turned on. A current flowing through the first current source 406 in FIG. 4 charges the capacitor 418 in FIG. 4, and thus a value of the second feedback signal FB2a is increased at a faster rate than the first feedback signal FB1 until the second feedback signal FB2a reaches a maximum value.

When the value of the second feedback signal FB2a is increased, the PWM controller increases one or both of the on-time duration and the switching frequency of the PWM signal. As a result, the primary side controller including the OU signal generator 320 in FIG. 3 and the feedback signal modulator 432 in FIG. 4 may prevent a severe undershoot of the output voltage.

At the second time $t_2$, the sampled voltage $V_{AOUT}$ becomes equal to or greater than the undershoot disable threshold voltage $V_{UN\_DIS}$, and the second flip-flop 312 in FIG. 3 generates the undershoot signal $DYN_{UN}$ having a logic low value in response to the second reset signal RST2 having a logic high value. In an embodiment, the undershoot disable threshold voltage $V_{UN\_DIS}$ has a level substantially equal to 95% of that of the predetermined reference voltage $V_{REF}$. As a result, the flip-flop 422 in FIG. 4 generates the undershoot end signal $UN_{END}$ having a logic high value in response to the undershoot signal $DYN_{UN}$ having a logic low value, and the second logic gate 414 in FIG. 4 generates an output signal having a logic high value in response to the undershoot end signal $UN_{END}$ having a logic high value to turn on the third switching device 426 in FIG. 4. The third logic gate 424 in FIG. 4 generates the dynamic control signal DYN having a logic high value in response to the undershoot end signal $UN_{END}$ having a logic high value to turn off the second switching device 416 in FIG. 4.

During a time interval between the second time $t_2$ and a third time t3, the second switching device 416 in FIG. 4 is turned off and the third switching device 426 in FIG. 4 is turned on. A current flowing through the second current source 420 in FIG. 4 discharges the capacitor 418 in FIG. 4, and thus a value of the second feedback signal FB2a is decreased until the second feedback signal FB2a reaches the first feedback signal FB1.

At the third time t3 when the second feedback signal FB2a reaches the first feedback signal FB1, the comparator 410 in FIG. 4 generates the comparison signal $DYN_{COM}$ having a logic high value in response to the second feedback signal FB2a and the first feedback signal FB1, and thus the flip-flop 422 in FIG. 4 generates the undershoot end signal $UN_{END}$ having a logic low value in response to the comparison signal $DYN_{COM}$ having a logic high value. The third logic gate 424 in FIG. 4 generates the dynamic control signal DYN having a logic low value, and thus the inverter 412 in FIG. 4 generates an output signal having a logic high value to turn on the second switching device 416. As a result, the second switching device 416 in FIG. 4 couples the input node I in FIG. 4 to the output node O in FIG. 4 to generate the second feedback signal FB2a, which is substantially the same as the first feedback signal FB1.

Figure 6:
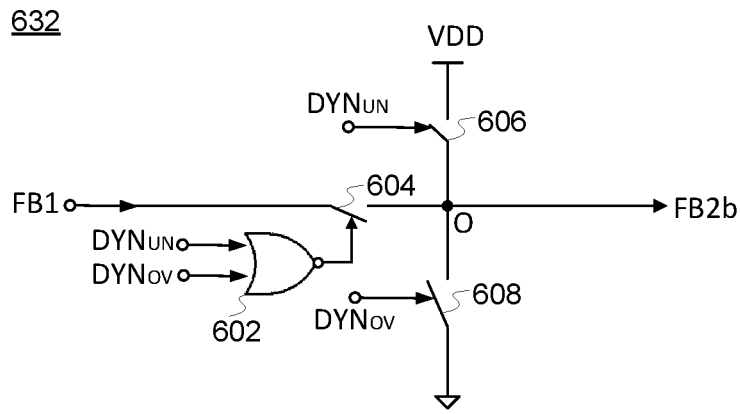
FIG. 6 illustrates a feedback signal modulator suitable for use as a feedback signal modulator of FIG. 2 according to an embodiment.

FIG. 6 illustrates a feedback signal modulator 632 suitable for use as the feedback signal modulator 232 of FIG. 2 according to another embodiment. The feedback signal modulator 632 in FIG. 6 includes a logic gate 602, an output node O, and first, second, and third switching devices 606, 604, and 608.

The logic gate 602 in FIG. 6 receives an overshoot signal $DYN_{OV}$ and an undershoot signal $DYN_{UN}$. In an embodiment, the logic gate 602 is a NOR gate and performs a NOR logical operation on the overshoot signal $DYN_{OV}$ and the undershoot signal $DYN_{UN}$ to provide an output signal to the second switching device 604.

The second switching device 604 in FIG. 6 is turned on or off in response to the output signal from the logic gate 602. In an embodiment, the second switching device 604 is turned on when the output signal from the logic gate 602 has a first logic value (e.g., a logic high value), and is turned off when the output signal from the logic gate 602 has a second logic value (e.g., a logic low value).

The first switching device 606 in FIG. 6 is turned on or off in response to the undershoot signal $DYN_{UN}$. In an embodiment, the first switching device 606 is turned on when the undershoot signal $DYN_{UN}$ has a first logic value (e.g., a logic high value) to couple the output node O to a power supply VDD, and is turned off when the undershoot signal $DYN_{UN}$ has a second logic value (e.g., a logic low value).

The third switching device 608 in FIG. 6 is turned on or off in response to the overshoot signal $DYN_{OV}$. In an embodiment, the third switching device 608 is turned on when the overshoot signal $DYN_{OV}$ has a first logic value (e.g., a logic high value) to couple the output node O to a ground, and is turned off when the overshoot signal $DYN_{OV}$ has a second logic value (e.g., a logic low value).

Figure 7A:
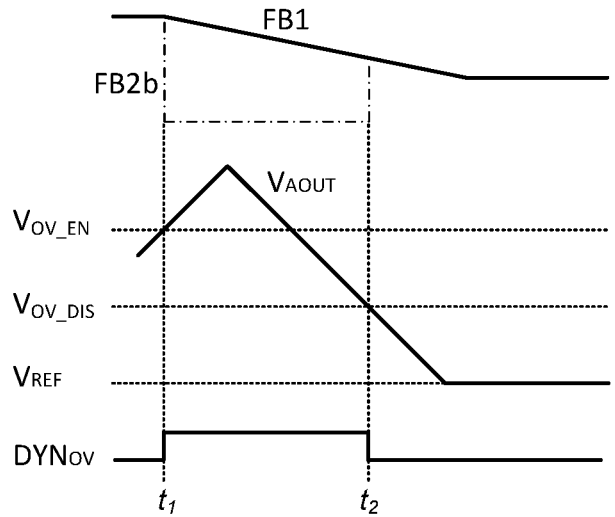
FIG. 7A example waveforms of a first feedback signal, a second feedback signal, a sampled voltage, and an overshoot signal when an overshoot of an output voltage of the power converter of FIG. 2 occurs under a load transient condition.

An operation of a primary side controller (e.g., the primary side controller 210 in FIG. 2), which includes the OU signal generator 320 in FIG. 3 and the feedback signal modulator 632 in FIG. 6, is explained below in more detail below with reference to FIGS. 7A and 7B. FIG. 7A illustrates example waveforms of the first feedback signal FB1, a second feedback signal FB2b, the sampled voltage $V_{AOUT}$, and the overshoot signal $DYN_{OV}$ when an overshoot of an output voltage (e.g., the output voltage $V_{OUT}$ in FIG. 2) occurs under a load transient condition.

At a first time $t_1$ in FIG. 7A, the sampled voltage $V_{AOUT}$ becomes greater than the overshoot enable threshold voltage $V_{OV\_EN}$, and the first flip-flop 306 in FIG. 3 generates the overshoot signal $DYN_{OV}$ having a logic high value in response to the first set signal SET1 having a logic high value. The logic gate 602 in FIG. 6 generates an output signal having a logic low value in response to the overshoot signal $DYN_{OV}$ having a logic high value to turn off the second switching device 604 in FIG. 6. The third switching device 608 in FIG. 6 is turned on in response to the overshoot signal $DYN_{OV}$ having a logic high value. As a result, the value of the second feedback signal FB2b is decreased to a minimum value (e.g., zero volt) at the first time $t_1$, e.g., substantially instantaneously.

At a second time $t_2$ in FIG. 7A, the sampled voltage $V_{AOUT}$ becomes less than the overshoot disable threshold voltage $V_{OV\_DIS}$, and the first flip-flop 306 in FIG. 3 generates the overshoot signal $DYN_{OV}$ having a logic low value in response to the first reset signal RST1 having a logic high value. The third switching device 608 in FIG. 6 is turned off in response to the overshoot signal $DYN_{OV}$ having a logic low value. The logic gate 602 in FIG. 6 generates the output signal having a logic high value in response to the overshoot signal $DYN_{OV}$ having a logic low value to turn on the second switching device 604 in FIG. 6. As a result, the second feedback signal FB2b reaches the first feedback signal FB1 at the second time $t_2$, e.g., substantially instantaneously.

Figure 7B:
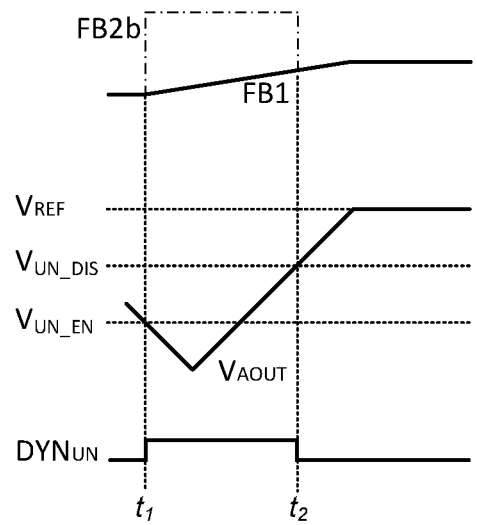
FIG. 7B illustrates example waveforms of the first feedback signal, the second feedback signal, the sampled voltage, and an undershoot signal when an undershoot of the output voltage of the power converter of FIG. 2 occurs under a load transient condition.

FIG. 7B illustrates example waveforms of the first feedback signal FB1, the second feedback signal FB2b, the sampled voltage $V_{AOUT}$, and the undershoot signal $DYN_{UN}$ when an undershoot of the output voltage occurs under a load transient condition.

At a first time $t_1$ in FIG. 7B, the sampled voltage $V_{AOUT}$ becomes less than the undershoot enable threshold voltage $V_{UN\_EN}$, and the second flip-flop 312 in FIG. 3 generates an undershoot signal $DYN_{UN}$ having a logic high value in response to the second set signal SET2 having a logic high value. The logic gate 602 in FIG. 6 generates the output signal having a logic low value in response to the undershoot signal $DYN_{UN}$ having a logic high value to turn off the second switching device 604 in FIG. 6. The first switching device 606 in FIG. 6 is turned on in response to the undershoot signal $DYN_{UN}$ having a logic high value. As a result, the value of the second feedback signal FB2b is increased to a maximum value (e.g., the power supply voltage VDD) at the first time $t_1$, e.g., substantially instantaneously.

At a second time $t_2$ in FIG. 7B, the sampled voltage $V_{AOUT}$ becomes equal to or greater than the undershoot disable threshold voltage $V_{UN\_DIS}$, and the second flip-flop 312 in FIG. 3 generates the undershoot signal $DYN_{UN}$ having a logic low value in response to the second reset signal RST2 having a logic high value. The first switching device 606 in FIG. 6 is turned off in response to the undershoot signal $DYN_{UN}$ having a logic low value. The logic gate 602 in FIG. 6 generates the output signal having a logic high value to turn on the second switching device 604 in FIG. 6. As a result, the second feedback signal FB2b reaches the first feedback signal FB1 at the second time $t_2$, e.g., substantially instantaneously.

Figure 8:
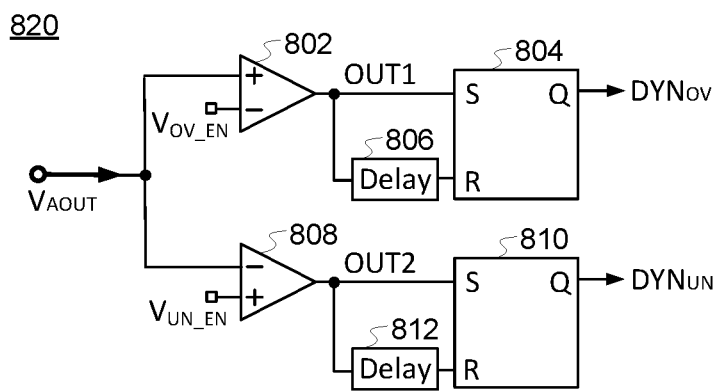
FIG. 8 illustrates an OU signal generator suitable for use as the OU signal generator of FIG. 2 according to an embodiment.

FIG. 8 illustrates an OU signal generator 820 suitable for use as the OU signal generator 220 of FIG. 2 according to another embodiment. The OU signal generator 820 in FIG. 8 includes a first comparator 802, a first delay circuit 806, a first flip-flop 804, a second comparator 808, a second delay circuit 812, and a second flip-flop 810.

The first comparator 802 in FIG. 8 compares a sampled voltage $V_{AOUT}$ to an overshoot enable threshold voltage $V_{OV\_EN}$, and generates a first output signal OUT1 having a logic high value when the sampled voltage $V_{AOUT}$ is equal to or greater than the overshoot enable threshold voltage $V_{OV\_EN}$. The first delay circuit 806 in FIG. 8 delays the first output signal OUT1 by a first delay amount to generate a delayed version of the first output signal OUT1.

In an embodiment, the first flip-flop 804 in FIG. 8 is a set/reset (RS) flip-flop. The RS flip-flop 804 generates an overshoot signal $DYN_{OV}$ having a first logic value (e.g., a logic high value) when the first output signal OUT1 has a logic high value, and generates the overshoot signal $DYN_{OV}$ having a second logic value (e.g., a logic low value) when the delayed version of the first output signal OUT1 has a logic high value. As a result, the RS flip-flop 804 generates a pulse having a width that corresponds to the first delay amount of the first delay circuit 806.

The second comparator 808 in FIG. 8 compares the sampled voltage $V_{AOUT}$ to an undershoot enable threshold voltage $V_{UN\_EN}$, and generates a second output signal OUT2 having a logic high value when the sampled voltage $V_{AOUT}$ is less than the undershoot enable threshold voltage $V_{UN\_EN}$. The second delay circuit 808 in FIG. 8 delays the second output signal OUT2 by a second delay amount to generate a delayed version of the second output signal OUT2.

In an embodiment, the second flip-flop 810 in FIG. 8 is a set/reset (RS) flip-flop. The RS flip-flop 810 generates an undershoot signal $DYN_{UN}$ having a first logic value (e.g., a logic high value) when the second output signal OUT2 has a logic high value, and generates the undershoot signal $DYN_{UN}$ having a second logic value (e.g., a logic low value) when the delayed version of the second output signal OUT2 has a logic high value. As a result, the RS flip-flop 810 generates a pulse having a width that corresponds to the second delay amount of the second delay circuit 810.

Figure 9A:
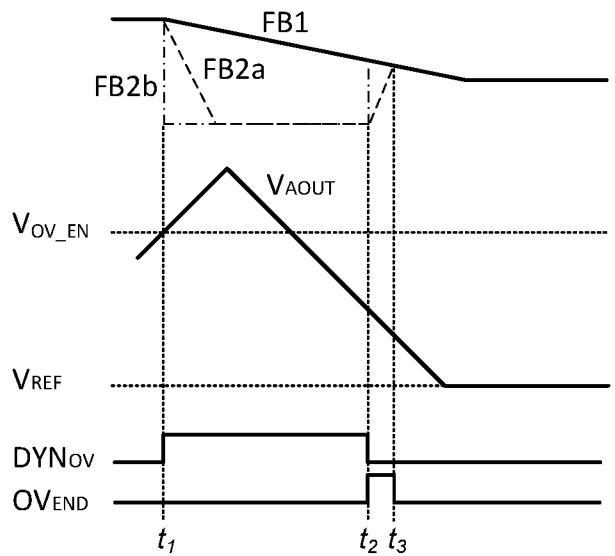
FIG. 9A illustrates example waveforms of a first feedback signal, second feedback signals, a sampled voltage, an overshoot signal, and an overshoot end signal when an overshoot of the output voltage of the power converter of FIG. 2 occurs under a load transient condition.

FIG. 9A illustrates an operation of a primary side controller (e.g., the primary side controller 210 in FIG. 2), which includes the OU signal generator 820 in FIG. 8 and the feedback signal modulator 432 in FIG. 4 or includes the OU signal generator 820 in FIG. 8 and the feedback signal modulator 632 in FIG. 6. Specifically, FIG. 9A illustrates example waveforms of the first feedback signal FB1, the second feedback signals FB2a and FB2b, the sampled voltage $V_{AOUT}$, the overshoot signal $DYN_{OV}$, and the overshoot end signal $OV_{END}$ when an overshoot of an output voltage (e.g., the output voltage $V_{OUT}$ in FIG. 2) occurs under a load transient condition.

Unlike the OU signal generator 320 in FIG. 3 including the second comparator 304, the OU signal generator 820 in FIG. 8 includes the first delay circuit 806. As a result, a time interval between a first time $t_1$ and a second time $t_2$ in FIG. 9A is determined by the first delay amount of the first delay circuit 806 in FIG. 8, rather than by a comparison result of the second comparator 304 in FIG. 3. Other operations of the OU signal generator 820 in FIG. 8 are similar to those of the OU signal generator 320 in FIG. 3, and thus detailed descriptions of these operations of the primary side controller including the OU signal generator 820 in FIG. 8 will be omitted herein for the interest of brevity.

Figure 9B:
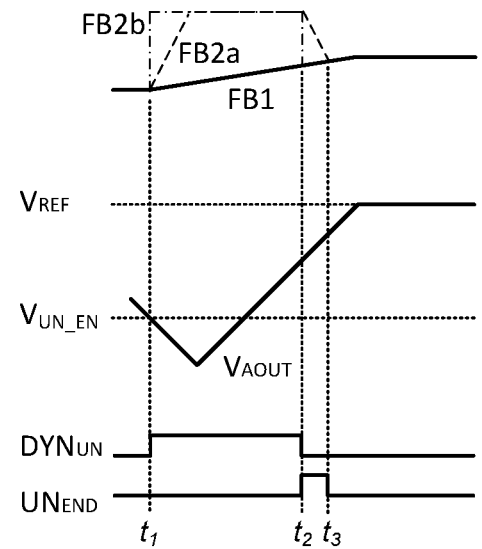
FIG. 9B illustrates example waveforms of the first feedback signal, the second feedback signals, the sampled voltage, an undershoot signal, and an undershoot end signal when an undershoot of the output voltage of the power converter of FIG. 2 occurs under a load transient condition.

FIG. 9B illustrates an operation of the primary side controller, which includes the OU signal generator 820 in FIG. 8 and the feedback signal modulator 432 in FIG. 4 or includes the OU signal generator 820 in FIG. 8 and the feedback signal modulator 632 in FIG. 6. Specifically, FIG. 9B illustrates example waveforms of the first feedback signal FB1, the second feedback signals FB2a and FB2b, the sampled voltage $V_{AOUT}$, the undershoot signal $DYN_{UN}$, and the undershoot end signal $UN_{END}$ when an undershoot of an output voltage (e.g., the output voltage $V_{OUT}$ in FIG. 2) occurs under a load transient condition.

Unlike the OU signal generator 320 in FIG. 3 including the fourth comparator 312, the OU signal generator 820 in FIG. 8 includes the second delay circuit 812. As a result, a time interval between a first time $t_1$ and a second time $t_2$ in FIG. 9B is determined by the second delay amount of the second delay circuit 812 in FIG. 8, rather than by a comparison result of the fourth comparator 312 in FIG. 3. Other operations of the OU signal generator 820 in FIG. 8 are similar to those of the OU signal generator 320 in FIG. 3, and thus detailed descriptions of these operations of the primary side controller including the OU signal generator 820 in FIG. 8 will be omitted herein for the interest of brevity.

Figure 10:
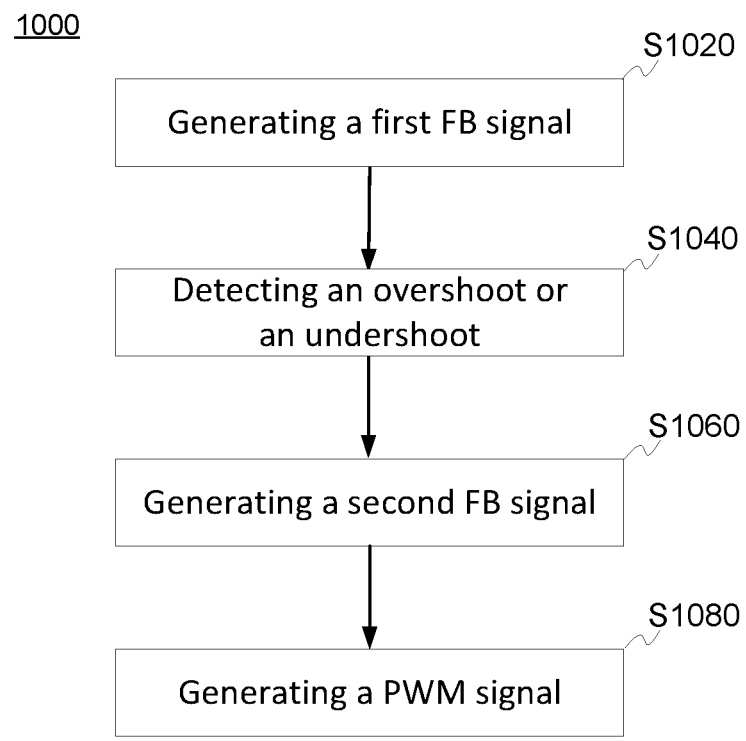
FIG. 10 illustrates a process performed by a controller according to an embodiment.

FIG. 10 illustrates a process 1000 performed by a controller (e.g., the primary side controller 210 of FIG. 2) according to an embodiment. In an embodiment, the controller includes an OU signal generator (e.g., the OU signal generator circuit 220 of FIG. 2), a feedback signal modulator (e.g., the feedback signal modulator 232 of FIG. 2), and a modulation controller (e.g., the PWM controller 234 of FIG. 2).

At S1020, the controller generates a first feedback signal (e.g., the first feedback signal FB1 of FIG. 2) in response to a sampled signal (e.g., the sampled signal $V_{AOUT}$ of FIG. 2), which indicates an output signal of a power converter (e.g., the power converter 200 of FIG. 2). In an embodiment, the controller further includes an amplifier (e.g., the amplifier 224 of FIG. 2) that generates the first feedback signal in response to the sampled signal and a reference voltage (e.g., the reference voltage $V_{REF}$ of FIG. 2).

At S1040, the OU signal generator detects an overshoot or an undershoot of the sampled signal. In an embodiment, the OU signal generator generates an overshoot signal having a first logic value (e.g., a logic high value) when the overshoot is detected, and generates an undershoot signal having a second logic value (e.g., a logic high value) when the undershoot is detected. In an embodiment, the first and second logic values are the same values, but may be different values in other embodiments.

At S1060, the feedback signal modulator generates a second feedback signal (e.g., the second feedback signal FB2 of FIG. 2) in response to the detection result and the first feedback signal. In an embodiment, the feedback signal modulator generates the second feedback signal that is different from the first feedback signal when the OU signal generator detects the overshoot of the sampled signal or the undershoot of the sampled signal.

At S1080, the modulation controller generates a modulation signal (e.g., the PWM signal PWM of FIG. 2) in response to the second feedback signal. In an embodiment, the modulation controller adjusts one or both of an on-time duration and a switching frequency of the modulation signal in response to the second feedback signal.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

What is claimed is:

1. A circuit for controlling a power converter comprising:
    an overshoot-and-undershoot (OU) signal generator configured to generate a signal indicating detection of an overshoot or an undershoot of an output signal of the power converter; and
    a feedback signal modulator including an input node and an output node, the feedback signal modulator being configured to receive a first feedback signal at the input node and the signal indicating detection of the overshoot or the undershoot and to generate a second feedback signal at the output node in response to the first feedback signal and the signal indicating detection of the overshoot or the undershoot,
    wherein the feedback signal modulator decouples the output node from the input node to generate the second feedback signal that is different from the first feedback signal when either the overshoot or the undershoot is detected, and couples the output node to the input node to output the first feedback signal as the second feedback signal at the output node when neither the overshoot nor the undershoot is detected,
    wherein the OU signal generator includes:
    a comparator comparing a tracking signal to an overshoot enable threshold signal or an undershoot enable threshold signal to generate a comparison signal, the tracking signal indicating the output signal of the power converter;
    a delay circuit configured to receive the comparison signal and output the received comparison signal with a given delay amount, a time interval during which the output node is decoupled from the input node corresponding to the given delay amount of the delay circuit; and
    a flip-flop generating the signal indicating detection of the overshoot or the undershoot and having a pulse width that corresponds to the given delay amount of the delay circuit.

2. The circuit of claim 1, wherein the signal indicating detection of the overshoot or the undershoot is an overshoot signal, and the OU signal generator generates the overshoot signal based on the tracking signal.

3. The circuit of claim 2, wherein the OU signal generator further generates an undershoot signal based on the tracking signal to output the undershoot signal to the feedback signal modulator, and
    wherein the feedback signal modulator further includes:
    a logic gate performing a logical operation on the overshoot signal and the undershoot signal; and
    a first switching device coupling the input node to the output node in response to an output signal of the logic gate.

4. The circuit of claim 3, wherein the feedback signal modulator further includes:
    a second switching device coupling a power supply voltage to the output node in response to the undershoot signal; and
    a third switching device coupling the output node to a ground in response to the overshoot signal.

5. The circuit of claim 1, wherein the signal indicating detection of the overshoot or the undershoot is an undershoot signal, and the OU signal generator generates the undershoot signal based on the tracking signal.

6. The circuit of claim 1, further comprising a modulation controller configured to generate a modulation signal in response to the second feedback signal,
    wherein the modulation controller adjusts one or both of an on-time duration and a switching frequency of the modulation signal in response to the second feedback signal.

7. The circuit of claim 1, wherein the feedback signal modulator couples the output node that generates the second feedback signal to a power supply voltage in response to the signal indicating detection of the overshoot or the undershoot.

8. A power converter comprising:
    a first side circuit generating an input signal; and
    a second side circuit generating an output signal in response to the input signal,
    wherein the first side circuit includes:
    a switching device; and
    a first side controller configured to generate a signal indicating detection of an overshoot or an undershoot of the output signal, generate a first feedback signal at a first node in response to a tracking signal, the tracking signal indicating the output signal, and generate a second feedback signal at a second node in response to the first feedback signal and the signal indicating detection of the overshoot or the undershoot, and
    wherein the first side controller decouples the second node from the first node to generate the second feedback signal that is different from the first feedback signal when either the overshoot or the undershoot is detected, and couples the second node to the first node to output the first feedback signal as the second feedback signal when neither the overshoot nor the undershoot is detected,
    wherein the first side controller includes:
    a comparator comparing a tracking signal to an overshoot enable threshold signal or an undershoot enable threshold signal to generate a comparison signal, the tracking signal indicating the output signal of the power converter;
    a delay circuit configured to receive the comparison signal and output the received comparison signal with a given delay amount, a time interval during which the second node is decoupled from the first node corresponding to the given delay amount of the delay circuit; and a flip-flop generating the signal indicating detection of the overshoot or the undershoot and having a pulse width that corresponds to the given delay amount of the delay circuit.

9. The power converter of claim 8, wherein the first side controller generates a modulation signal and adjusts one or both of an on-time duration and a switching frequency of the modulation signal in response to the second feedback signal.

10. A method for controlling a power converter, the method comprising:

receiving a first feedback signal at a first node;

generating a second feedback signal at a second node in response to the first feedback signal and a signal indicating detection of an overshoot or an undershoot of the power converter;

decoupling the second node from the first node to generate the second feedback signal that is different from the first feedback signal when either the overshoot or the undershoot is detected;

coupling the second node to the first node to output the first feedback signal as the second feedback signal when neither the overshoot nor the undershoot is detected;

comparing a tracking signal to an overshoot enable threshold signal or an undershoot enable threshold signal to generate a comparison signal, the tracking signal indicating the output signal of the power converter;

receiving the comparison signal and outputting the received comparison signal with a given delay amount, a time interval during which the second node is decoupled from the first node corresponding to the given delay amount; and generating the signal indicating detection of the overshoot or the undershoot and having a pulse width that corresponds to the given delay amount.

11. The method of claim 10, wherein the signal indicating detection of the overshoot or the undershoot is an overshoot signal, the method further comprising generating the overshoot signal based on the tracking signal.

12. The method of claim 10, further comprising de-asserting the signal indicating detection of the overshoot or the undershoot by a delay circuit.

\* \* \* \* \*